United States Patent
Zhang

(10) Patent No.: US 10,330,471 B2
(45) Date of Patent: Jun. 25, 2019

(54) TRIAXIAL MICRO-ELECTROMECHANICAL GYROSCOPE

(71) Applicant: Goertek, Inc., Shandong (CN)

(72) Inventor: Tingkai Zhang, Shandong (CN)

(73) Assignee: Goertek, Inc., Shangdong (CN)

( * ) Notice: Subject to any disclaimer, the term of this patent is extended or adjusted under 35 U.S.C. 154(b) by 176 days.

(21) Appl. No.: 15/529,491

(22) PCT Filed: Jul. 23, 2015

(86) PCT No.: PCT/CN2015/084973
§ 371 (c)(1),
(2) Date: May 24, 2017

(87) PCT Pub. No.: WO2016/082571
PCT Pub. Date: Jun. 2, 2016

(65) Prior Publication Data
US 2017/0261321 A1 Sep. 14, 2017

(30) Foreign Application Priority Data

Nov. 27, 2014 (CN) .......................... 2014 1 0706276
Nov. 27, 2014 (CN) .......................... 2014 1 0710065
(Continued)

(51) Int. Cl.
*G01C 19/56* (2012.01)
*G01C 19/00* (2013.01)
(Continued)

(52) U.S. Cl.
CPC .............. *G01C 19/26* (2013.01); *B81B 7/008* (2013.01); *G01C 19/08* (2013.01); *G01C 19/56* (2013.01);
(Continued)

(58) Field of Classification Search
CPC ............ G01C 19/5705; G01C 19/5712; G01C 19/5733
See application file for complete search history.

(56) References Cited

U.S. PATENT DOCUMENTS 8,256,290 B2    9/2012   Mao
9,863,769 B2 *  1/2018   Anac ................. G01C 19/5712
(Continued)

FOREIGN PATENT DOCUMENTS

CN    101839718    9/2010
CN    102221361    10/2011
(Continued)

OTHER PUBLICATIONS

International Search Report, PCT/CN2015/084973, dated Sep. 21, 2015 (3 pages).
(Continued)

*Primary Examiner* — Leslie J Evanisko
*Assistant Examiner* — Ruben C Parco, Jr.
(74) *Attorney, Agent, or Firm* — Patent Law Works LLP

(57) ABSTRACT

The present invention is related to a triaxial micro-electromechanical gyroscope, comprising: a ring-shaped detection capacitor located at the center; two sets of driving capacitors located at outer sides of the ring-shaped detection capacitor and symmetrically distributed at two sides of an origin along a y-axis; two sets of second detection capacitors located at the outer sides of the ring-shaped detection capacitor respectively and symmetrically distributed at the two sides of the origin along an x-axis; and a linkage part connected with movable polar plates of the driving capacitors, movable polar plates of the second detection capacitors, and an outer edge of ring-shaped upper polar plates of the ring-shaped detection capacitor, respectively. The triaxial micro-electromechanical gyroscope provided by the present invention
(Continued)

adopts a single structure design, and integrates capacitive electrostatic driving and differential capacitive detection.

15 Claims, 10 Drawing Sheets

(30) Foreign Application Priority Data

| Nov. 27, 2014 | (CN) | 2014 2 0731958 U |
|---|---|---|
| Nov. 27, 2014 | (CN) | 2014 2 0732602 U |
| Nov. 27, 2014 | (CN) | 2014 2 0734425 U |

(51) Int. Cl.
| | |
|---|---|
| G01C 19/26 | (2006.01) |
| G01C 19/5684 | (2012.01) |
| G01C 19/5691 | (2012.01) |
| B81B 7/00 | (2006.01) |
| G01C 19/08 | (2006.01) |
| G01C 19/5733 | (2012.01) |
| G01C 19/02 | (2006.01) |

(52) U.S. Cl.
CPC ..... *G01C 19/5684* (2013.01); *G01C 19/5691* (2013.01); *G01C 19/5733* (2013.01); *B81B 7/0003* (2013.01); *G01P 9/02* (2013.01)

(56) References Cited

U.S. PATENT DOCUMENTS

| 2003/0183007 A1* | 10/2003 | Willig | G01C 19/5747 73/504.12 |
|---|---|---|---|
| 2009/0260437 A1* | 10/2009 | Blomqvist | G01C 19/5712 73/504.12 |
| 2009/0320592 A1* | 12/2009 | Glenn | B81B 3/0051 73/504.12 |
| 2010/0236327 A1 | 9/2010 | Mao | |
| 2016/0084653 A1* | 3/2016 | Balslink | G01C 19/5712 73/504.12 |
| 2017/0261322 A1* | 9/2017 | Gattere | G01C 19/5712 |
| 2018/0216935 A1* | 8/2018 | Senkal | G01C 19/5712 |

FOREIGN PATENT DOCUMENTS

| CN | 102853825 A | 1/2013 |
|---|---|---|
| CN | 103411595 A | 11/2013 |
| CN | 103438878 A | 12/2013 |
| CN | 103697875 A | 4/2014 |
| CN | 103822620 A | 5/2014 |
| CN | 104406579 | 3/2015 |
| CN | 104457726 | 3/2015 |
| CN | 204188168 | 3/2015 |
| CN | 204188169 | 3/2015 |
| CN | 204188170 | 3/2015 |
| EP | 2775258 | 9/2014 |
| JP | 2007304046 A | 11/2007 |
| JP | 2009058313 A | 3/2009 |
| KR | 10-2017-0072327 A | 6/2017 |

OTHER PUBLICATIONS

International Search Report and Written Opinion (with English translation) dated Sep. 21, 2015 (14 pages).

Chinese Office Action dated Nov. 2, 2016, Chinese Application No. 201410710065.5, with English translation of Search Report (10 pages).

* cited by examiner

TRIAXIAL MICRO-ELECTROMECHANICAL GYROSCOPE

TECHNICAL FIELD

The present invention is related to a micro-electromechanical gyroscope, and more particularly, to a single-structure triaxial micro-electromechanical gyroscope.

BACKGROUND

A micro electro mechanical system (MEMS) is a new technology developed on the basis of the microelectronic technology and integrating micro-machines, micro-sensors, micro-actuators, signal processing and intelligent control.

A micro-electromechanical gyroscope is an MEMS technology-based inertial device for measuring the angular velocity of an object in movement. It has the characteristics of being small in size, high in reliability, low in cost and suitable for mass production. Thus, it has a broad market prospect and can be applied to a wide range of fields including consumer electronics, aerospace, automotives, medical equipment and weapons.

In general, a micro-electromechanical gyroscope comprises a driving part and a detecting part, so that its design is relatively complex, and it is especially complex when involved in a micro-electromechanical gyroscope which performs three-axis measurement simultaneously. At present, the triaxial micro-electromechanical gyroscope is implemented mainly by a design manner in which three single-axis gyroscopes or a Z-axis gyroscope and a plane detection gyroscope are arranged in an orthogonal manner. However, this combination is not conducive to the device miniaturization. Therefore, the development of the single-structure triaxial gyroscope turns into an important aspect in the design and research of the micro-electromechanical gyroscope.

SUMMARY

It is an object of the present invention to provide a high-performance triaxial micro-electromechanical gyroscope adopting a single structure design. In order to achieve the above object, the present invention adopts the following technical solution.

A triaxial micro-electromechanical gyroscope comprises: a substrate; a ring-shaped detection capacitor located at a central position of the substrate, wherein the center of the ring-shaped detection capacitor is an origin, the ring-shaped detection capacitor comprises four lower polar plates fixed onto the substrate and four ring-shaped upper polar plates that directly face and are hung above the four lower polar plates, the four lower polar plates are divided into two groups, the first group of lower polar plates is symmetrically distributed at two sides of the origin along an x-axis, and cooperates with the corresponding ring-shaped upper polar plates to form a set of first detection capacitor, the second group of lower polar plates is symmetrically distributed at the two sides of the origin along a y-axis, and cooperates with the corresponding ring-shaped upper polar plates to form the other set of first detection capacitor, and the ring-shaped upper polar plates are fixed onto the substrate at the origin via a first anchor point; two sets of driving capacitors which are located at the outer sides of the ring-shaped detection capacitor respectively and are symmetrically distributed at the two sides of the origin along the y-axis, wherein each set of the driving capacitors comprises a movable driving electrode and a fixed driving electrode which cooperate with each other; two sets of second detection capacitors which are located at the outer sides of the ring-shaped detection capacitor respectively and are symmetrically distributed at the two sides of the origin along the x-axis, wherein each set of the second detection capacitors comprises a movable detection electrode and a fixed detection electrode which cooperate with each other; and a linkage part connected with the movable driving electrodes, the movable detection electrodes, and outer edges of the ring-shaped upper polar plates, respectively, wherein the driving capacitors are configured for providing driving forces in the y-axis direction, and driving the movable detection electrodes to linearly move in the y-axis direction as well as the ring-shaped upper polar plates to rotate around the first anchor point via the linkage part.

Preferably, the movable driving electrodes and the fixed driving electrodes are comb-shaped electrodes, and the movable detection electrodes and the fixed detection electrodes are comb-shaped electrodes.

Preferably, each ring-shaped upper polar plate takes the shape of a ring or a square ring.

Preferably, the two lower polar plates in the first group of lower polar plates have the same shape, so do the two lower polar plates in the second group of lower polar plates.

Preferably, the linkage part comprises a rectangular outer frame and a first linkage part located inside the rectangular outer frame; the rectangular outer frame encircles the ring-shaped detection capacitor, and is connected with the outer edges of the ring-shaped upper polar plates via the first linkage part; the two sets of driving capacitors are symmetrically distributed at two sides, parallel to the x-axis, of the rectangular outer frame, and the movable driving electrodes are connected with the sides, parallel to the x-axis, of the rectangular outer frame; and the two sets of second detection capacitors are symmetrically distributed at the two sides, parallel to the y-axis, of the rectangular outer frame, and the movable detection electrodes are connected with the sides, parallel to the y-axis, of the rectangular outer frame, wherein the driving capacitors drive the rectangular outer frame to linearly move in the y-axis direction, and the rectangular outer frame that linearly moves in the y-axis direction drives the ring-shaped upper polar plates to rotate around the first anchor point via the first linkage part.

Preferably, the first linkage part includes a first linkage beam, two lever beams, two second linkage beams and a third linkage beam; the first linkage beam and the second linkage beams are parallel to the y-axis, and the lever beams and the third linkage beam are parallel to the x-axis; the two lever beams are respectively connected with the first linkage beam to form a box structure with an open end, and the ring-shaped detection capacitor is located between the two lever beams; the two second linkage beams are symmetrical with respect to the x-axis and are located between the lever beams and the rectangular outer frame; one end of the second linkage beam is connected with the adjacent lever beam, and the other end thereof is connected with the rectangular outer frame; and one end of the third linkage beam is connected with the middle part of the first linkage beam, and the other end thereof is connected with the outer edge of the ring-shaped upper polar plate.

Preferably, the first linkage part further comprises two support beams, both of which are parallel to the y-axis; the two support beams are symmetrical with respect to the x-axis and are located between the box structure and the ring-shaped detection capacitor; one end of the support beam is connected with the adjacent lever beam, and the other end thereof is fixed onto the substrate via a third anchor point c.

Preferably, the end, unconnected with the first linkage beam, of the lever beam serves as a support end, and the support end of each of the two lever beams is fixed onto the substrate via a second anchor point; and a connection position of each second linkage beam and the corresponding lever beam is located in the middle of the support end of the level beam and a connection point of the level beam and the corresponding support beam.

Preferably, the first linkage part further comprises a rectangular inner frame and a second linkage part; the rectangular inner frame is located within the rectangular outer frame and encircles the box structure, and the rectangular outer frame is connected with the rectangular inner frame via the second linkage part; and the second linkage beams are located between the lever beams and the rectangular inner frame, and are connected with the rectangular outer frame via the rectangular inner frame, wherein the second linkage beams that linearly move in the y-axis direction drive the rectangular inner frame to linearly move in the y-axis direction via the second linkage part.

Preferably, the second linkage part is composed of Z-type decoupling beams; and one ends of the Z-type decoupling beams are connected with the sides, parallel to the y-axis, of the rectangular inner frame, and the other ends thereof are connected with the sides, parallel to the y-axis, of the rectangular outer frame.

Preferably, the linkage part comprises a three-layered rectangular frame, which is located on the substrate, adopts the origin as the center and comprises an inner frame, an intermediate frame encircling the inner frame, and an outer frame encircling the intermediate frame from inside to outside sequentially. Each of the inner frame, the intermediate frame and the outer frame has two sides parallel to the x-axis while the other two sides thereof are parallel to the y-axis; the two sets of driving capacitors are symmetrically distributed at the two sides, parallel to the x-axis, of the outer frame, and the movable driving electrodes are connected with the sides, parallel to the x-axis, of the outer frame; the two sets of second detection capacitors are symmetrically distributed at the two sides, parallel to the y-axis, of the outer frame, and the movable detection electrodes are connected with the sides, parallel to the y-axis, of the outer frame; the outer frame and the intermediate frame are connected via first decoupling beams arranged at the two sides, parallel to the y-axis, of the intermediate frame; and the intermediate frame and the inner frame are connected via second decoupling beams arranged at the two sides, parallel to the x-axis, of the inner frame. A third linkage part is located inside the inner frame; the third linkage part comprises a first linkage beam, two lever beams, two second linkage beams and a third linkage beam; the first linkage beam and the second linkage beams are parallel to the y-axis, and the lever beams and the third linkage beam are parallel to the x-axis; the two lever beams are symmetrical with respect to the x-axis, and are respectively connected with the first linkage beam to form a box structure with an open end, and the ring-shaped detection capacitor is located between the two lever beams; the two second linkage beams are symmetrical with respect to the x-axis and are located between the lever beams and the inner frame; one end of the second linkage beam is connected with the adjacent lever beam, and the other end thereof is connected with the rectangular outer frame; and one end of the third linkage beam is connected with the middle part of the first linkage beam, and the other end thereof is connected with the outer edge of the ring-shaped upper polar plate.

Preferably, the first decoupling beams comprise four Z-type decoupling beams symmetrical with respect to the y-axis; one ends of the Z-type decoupling beams are vertically connected with the sides, parallel to the y-axis, of the intermediate frame, and the other ends thereof are vertically connected with the sides, parallel to the y-axis, of the outer frame; or the first decoupling beams comprise four L-type decoupling beams symmetrical with respect to the y-axis; one ends of the L-shaped decoupling beams are vertically connected with the sides, parallel to the y-axis, of the intermediate frame, and the other ends thereof are vertically connected with the sides, parallel to the x-axis, of the outer frame. The second decoupling beams comprise four Z-type decoupling beams symmetrical with respect to the x-axis; one ends of the Z-type decoupling beams are vertically connected with the sides, parallel to the x-axis, of the inner frame, and the other ends thereof are vertically connected with the sides, parallel to the x-axis, of the intermediate frame; or the second decoupling beams comprise four L-type decoupling beams symmetrical with respect to the x-axis, one ends of the L-shaped decoupling beams are vertically connected with the sides, parallel to the x-axis, of the inner frame, and the other ends thereof are vertically connected with the sides, parallel to the y-axis, of the intermediate frame.

Preferably, the third linkage part further comprises two support beams, both of which are parallel to the y-axis; the two support beams are symmetrical with respect to the x-axis and are located between the box structure and the ring-shaped detection capacitor; and one end of the support beam is connected with the adjacent lever beam, and the other end thereof is fixed onto the substrate via a third anchor point c.

Preferably, the end, unconnected with the first linkage beam, of the lever beam serves as a support end, and the support end of each of the two lever beams is fixed onto the substrate via a second anchor point; and a connection position of each second linkage beam and the corresponding lever beam is located between the support end of the lever beam and a connection point of the level beam and the corresponding support beam.

Preferably, the triaxial micro-electromechanical gyroscope further comprises a support beam group located within the ring holes of the ring-shaped detection capacitor. The support beam group comprises an inner ring and an outer ring which are concentric, two inner ring support beams, two inner and outer ring connecting beams and four outer ring connecting beams; one ends of the four outer ring connecting beams are respectively connected with the outer ring, and the other ends thereof are respectively connected with an inner edge of the ring-shaped upper polar plates; the outer ring connecting beams are divided into two groups, one group of outer ring connecting beams is distributed along the x-axis, and the other group of outer ring connecting beams is distributed along the y-axis; one ends of the two inner ring support beams are respectively connected with the inner ring, and the other ends thereof are fixed onto the substrate at the origin via the first anchor point; and one ends of the two inner and outer ring connecting beams are respectively connected with the inner ring, and the other ends thereof are respectively connected with the outer ring. The inner ring support beams are distributed along the y-axis, and the inner and outer ring connecting beams are distributed along the x-axis; or, the inner ring support beams are distributed along the x-axis and the inner and outer ring connecting beams are distributed along the y-axis.

The triaxial micro-electromechanical gyroscope provided by the present invention adopts a single structure design, and integrates capacitive electrostatic driving and differential capacitive detection, so that the driving manner is simple, the structure is compact, the gyroscope size is reduced advantageously, the gyroscope is suitable for mass production in process, and excellent measurement accuracy and sensitivity can be realized.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DESCRIPTION OF THE REFERENCE NUMERALS

Figure 1:
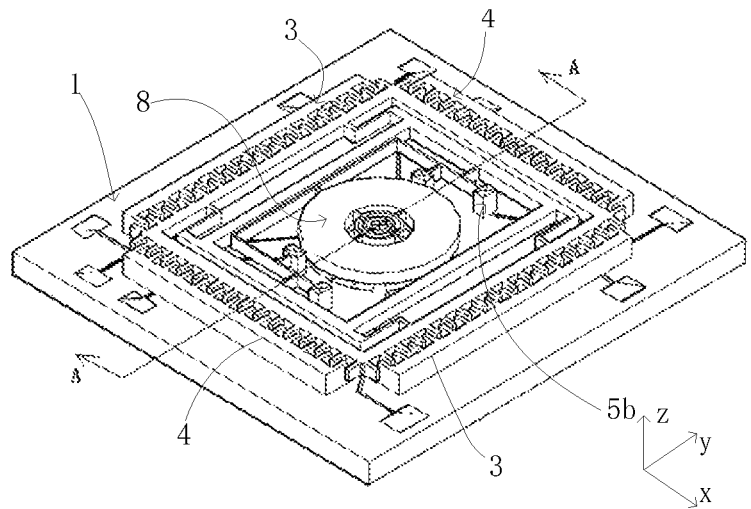
FIGS. 1 and 2 are schematic perspective views of a triaxial micro-electromechanical gyroscope according to a first embodiment of the present invention.

1: substrate; 8: ring-shaped upper polar plate; 6a: first group of lower polar plates; 6b: second group of lower polar plates; 16: movable driving electrode; 4: fixed driving electrode; 17: movable detection electrode; 3: fixed detection electrode; 13: rectangular inner frame; 14: rectangular outer frame; 131: inner frame; 1314: intermediate frame; 141: outer frame; 15: Z-type decoupling beam; 151: first decoupling beam; 152: second decoupling beam; 9: first linkage beam; 10: lever beam; 11: second linkage beam; 12: support beam; 24: third linkage beam; 18: support beam group; 19: inner ring; 20: outer ring; 21: inner ring support beam; 22: inner and outer ring connecting beam; 23: outer ring connecting beam; 101: connecting beam; 102: support beam; 103: ring; 5a: first anchor point; 5b: second anchor point; and 5c: third anchor point.

DETAILED DESCRIPTION

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses. Techniques, methods and apparatus as known by one of ordinary skill in the relevant art may not be discussed in detail but are intended to be part of the specification where appropriate. In all of the examples illustrated and discussed herein, any specific values should be interpreted to be illustrative only and non-limiting. Thus, other examples of the exemplary embodiments could have different values. Notice that similar reference numerals and letters refer to similar items in the following figures, and thus once an item is defined in one figure, it is possible that it need not be further discussed in the accompanying drawings.

I. FIGS. 1-6 show a triaxial micro-electromechanical gyroscope according to a first embodiment of the present invention.

As shown in FIG. 1, there is a ring-shaped detection capacitor at the central position of a substrate 1; it is defined that the center of the ring-shaped detection capacitor serves as an origin O; a plane of the substrate 1 is a space rectangular coordinate system of an x-y plane; and a z-axis of the space rectangular coordinate system is perpendicular to the substrate 1.

Figure 3:
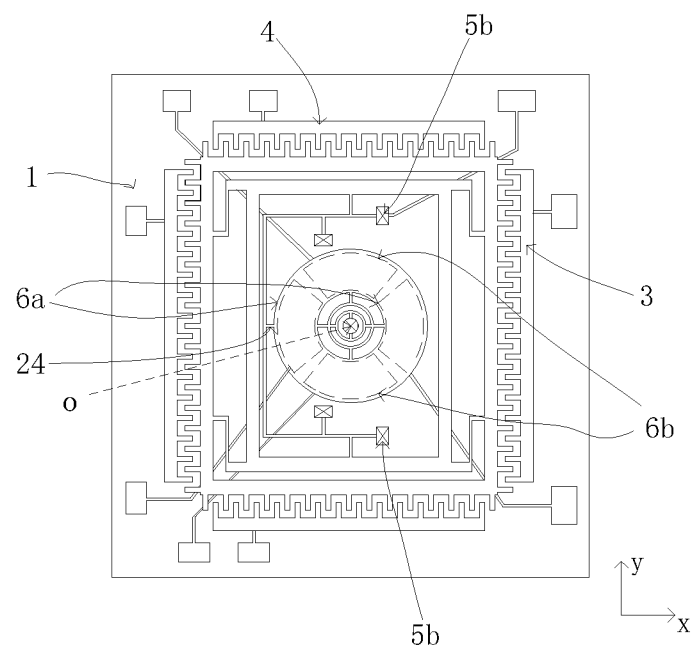
FIGS. 3 and 4 are schematic plan views of the triaxial micro-electromechanical gyroscope according to the first embodiment of the present invention.
Figure 4:
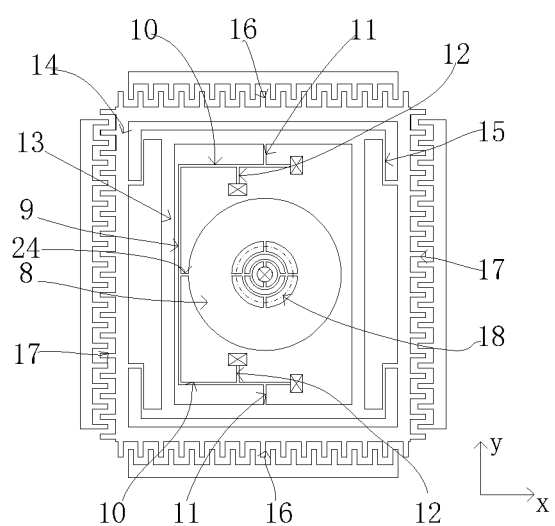

Referring to FIG. 3, the ring-shaped detection capacitor includes four lower polar plates fixed to the substrate and four ring-shaped upper polar plates 8 that directly face and are hung above the four lower polar plates, and a layout form of the lower polar plates is fit to that of the upper polar plates 8.

The four lower polar plates are divided into two groups. The first group of two lower polar plates 6a is symmetrically distributed at two sides of the origin along an x-axis, and is the same in shape; and the first group of lower polar plates 6a cooperates with the corresponding ring-shaped upper polar plates 8 to form a set of first detection capacitor A. The second group of two lower polar plates 6b is symmetrically distributed at the two sides of the origin along a y-axis, and is the same in shape; and the second group of lower polar plates 6b cooperates with the corresponding ring-shaped upper polar plates 8 to form the other set of first detection capacitor B.

The ring-shaped upper polar plates 8 are hung above the lower polar plates via a support structure which is located within the ring holes of the ring-shaped detection capacitor and is connected with an inner edge of the ring-shaped upper polar plates 8. The support structure is fixed onto the substrate at the origin via a first anchor point 5a. As only the center of the support structure is fixed, the ring-shaped upper polar plates 8 can perform angular vibration along any of the x-axis, y-axis and z-axis under the action of an external force.

Figure 5:
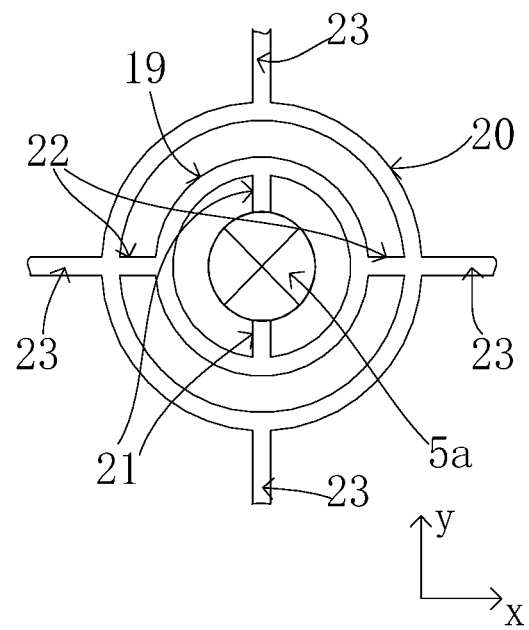
FIG. 5 is a schematically structural view of a support beam group of the triaxial micro-electromechanical gyroscope according to the first embodiment of the present invention.

FIG. 5 shows a schematically structural view of the support structure according to the embodiment. The support structure is a support beam group 18. The support beam group comprises an inner ring 19 and an outer ring 21 which are concentric, two inner ring support beams 21, two inner and outer ring connecting beams 22 and four outer ring connecting beams 23. One ends of the four outer ring connecting beams 23 are respectively connected with the outer ring 20, and the other ends thereof are respectively connected with the inner edges of the ring-shaped upper polar plates 8. The outer ring connecting beams 23 are evenly grouped by two, one group of outer ring connecting beams is distributed along the x-axis, and the other group of outer ring connecting beams is distributed along the y-axis; and all of the outer ring connecting beams 23 evenly divide the outer circumference of the outer ring 20. One ends of the two inner ring support beams 21 are respectively connected with the inner ring 19, and the other ends thereof are fixed onto the substrate at the origin via the first anchor point 5a. One ends of the two inner and outer ring connecting beams 22 are respectively connected with the inner ring 19, and the other ends thereof are respectively connected with the outer ring 20. The inner ring support beams 21 are distributed along the y-axis, and the inner and outer ring connecting beams 22 are distributed along the x-axis. In other embodiments, the inner ring support beams 21 may be distributed along the x-axis and the inner and outer ring connecting beams 22 may be distributed along the y-axis.

Figure 2:
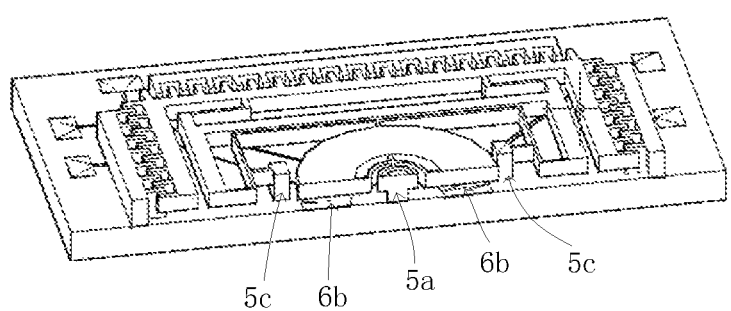

It can be seen from the cross-section portion of FIG. 2 that the inner edge of the ring-shaped upper polar plates 8 is connected with the support beam group 18 within the ring holes, and the support beam group 18 is fixed onto the substrate 1 at the origin via the first anchor point 5a, so that the ring-shaped upper polar plates 8 are hung above the lower polar plates by virtue of the support of the first anchor point 5a. As only the center of the support beam group is fixed, and the support beam group is thin and has a certain degree of flexibility, the ring-shaped upper polar plates 8 can perform angular vibration along any of the x-axis, y-axis and z-axis under the action of an external force.

Each ring-shaped upper polar plate 8 takes the shape of a ring. But it should be noted that in the present invention, the shape is not limited to the ring. In the present invention, the "ring" refers to a structure with a hole in the center, for example, a ring shape with circular inner and outer edges, a square ring shape with square circular inner and outer edges, a shape with a circular outer edge and a square inner edge, a shape with a square outer edge and a circular inner edge, a crossed shape with a hole in the center, etc., all of which are within the protection scope of equivalent embodiments of the present invention.

The ring-shaped upper polar plates 8 and the support structure may be directly integrated. For example, they can be formed by integrally etching after patterning.

A ring-shaped variable capacitor formed by the ring-shaped detection capacitor and the support structure can measure deformation in two directions, meanwhile, has the advantages of small deformation resistance and large deformation space, and can realize excellent measurement accuracy and sensitivity. The ring-shaped variable capacitor of the present invention is simple and compact in structure, so that the size of the micro-electromechanical system is reduced advantageously, and it is suitable for mass production in process. Except for being applied to the triaxial gyroscope of the present invention, the ring-shaped variable capacitor can be used in the production of a flat biaxial gyroscope, a z-axis gyroscope and a micro-actuator, such as a micro-switch.

Figure 6:
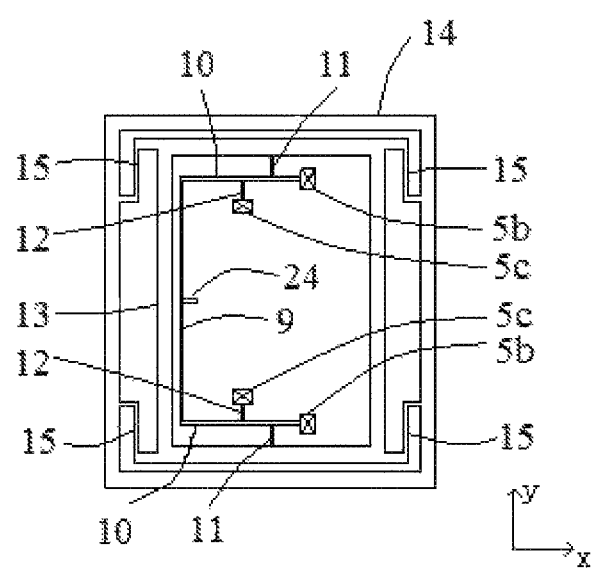
FIG. 6 is a schematically structural view of a linkage part of the triaxial micro-electromechanical gyroscope according to the first embodiment of the present invention.

As shown in FIG. 6, the linkage part in the first embodiment is a micro-electromechanical deformable structure, and comprises a rectangular inner frame 13, a rectangular outer frame 14, four Z-type decoupling beams 15, a first linkage beam 9, two lever beams 10, two second linkage beams 11, two support beams 12 and a third linkage beam 24.

The rectangular outer frame 14 encircles the rectangular inner frame 13, and the centers of the rectangular outer frame 14 and the rectangular inner frame 13 directly face the origin.

The rectangular inner frame 13 is connected with the rectangular outer frame 14 via the four Z-type decoupling beams 15. The Z-type decoupling beams 15 are distributed at four corners of the rectangular inner frame 13, respectively, and are symmetrically distributed at two sides, parallel to the y-axis, of the rectangular inner frame 13. One ends of the Z-type decoupling beams 15 are connected with sides, parallel to the y-axis, of the rectangular inner frame 13, and the other ends thereof are connected to sides, parallel to the y-axis, of the rectangular outer frame 14.

It should be noted that the number of the Z-type decoupling beams 15 is variable, and all that is needed is to ensure that one end(s) of the Z-type decoupling beams 15 is (are) connected with the sides, parallel to the y-axis, of the rectangular inner frame 13, and the other end(s) is (are) connected to the sides, parallel to the y-axis, of the rectangular outer frame 14. Preferably, the Z-type decoupling beams are divided into two groups, and are symmetrically distributed at the two sides, parallel to the y-axis, of the rectangular inner frame 13.

The first linkage beam 9, the second linkage beams 11 and the support beams 12 are parallel to the y-axis, and the lever beams 10 and the third linkage beam 24 are parallel to the x-axis. The two lever beams 10 are symmetrical with respect to the x-axis and are respectively connected with the first linkage beam 9 to form a box structure with an open end. The box structure is located inside the rectangular inner frame 13, and the ring-shaped detection capacitor is located between the two lever beams 10. The second linkage beams 11 are symmetrical with respect to the x-axis and are located between the lever beams 10 and the rectangular inner frame 13. One end of the second linkage beam 11 is connected with the adjacent lever beam 10, and the other end thereof is connected with the rectangular inner frame 13, so that the rectangular inner frame 13 is connected with the rectangular outer frame 14. One end of the third linkage beam 24 is connected with the middle part of the first linkage beam 9, and the other end thereof is connected with the outer edge of the ring-shaped upper polar plate 8. The two support beams 12 are symmetrical with respect to the x-axis and are located between the box structure and the ring-shaped detection capacitor. One end of the support beam is connected with the adjacent lever beam 10, and the other end thereof is fixed onto the substrate 1 via a third anchor point 5c. The end, unconnected with the first linkage beam 9, of the lever beam 10 serves as a support end, and the two support ends of the two lever beams 10 are fixed onto the substrate 1 via second anchor points 5b, respectively. A connection position of each second linkage beam 11 and the corresponding lever beam 10 is located in the middle of the support end of the level beam 10 and a connection point of the level beam 10 and the corresponding support beam 12. The two second anchor points 5b are symmetric with respect to the x-axis, and the two third anchor points 5c are symmetric with respect to the x-axis, such that the rectangular inner and outer frames are stressed uniformly further by virtue of this symmetrical and fixed arrangement.

The two sets of driving capacitors are symmetrically distributed at two sides, parallel to the x-axis, of the rectangular outer frame 14. Each set of the driving capacitors comprises a movable driving electrode 16 and a fixed driving electrode 4 cooperated with each other. The movable driving electrodes 16 are connected with the sides, parallel to the x-axis, of the rectangular outer frame 14, and the fixed driving electrodes 4 are fixed onto the substrate 1.

The two sets of second detection capacitors are symmetrically distributed at two sides, parallel to the y-axis, of the rectangular outer frame 14. Each set of second detection capacitor comprises a movable detection electrode 17 and a fixed detection electrode 3 cooperated with each other. The movable detection electrodes 17 are connected with the sides, parallel to the y-axis, of the rectangular outer frame 14, and the fixed detection electrodes 3 are fixed onto the substrate 1.

In this embodiment, the movable driving electrodes 16, the fixed driving electrodes 4, the movable detection electrodes 17 and the fixed detection electrodes 3 are comb-shaped electrodes.

The working principle of the triaxial micro-electromechanical gyroscope according to the first embodiment of the present invention is as follows.

The driving capacitors are used to provide driving force in the y-axis direction. When driven by an external force, the rectangular outer frame 14, the movable driving electrodes 16 and the movable detection electrodes 17 are linearly moved in the y-axis direction, and the Z-shaped decoupling beams 15 drive the rectangular inner frame 13 to move in the y-axis direction. Meanwhile, the second linkage beams 11 drag the lever beams 10 to linearly move in the y-axis direction, such that the first linkage beam 9 is driven to linearly moved in the y-axis direction as the lever beams 10 are equivalent to levers, wherein the movement direction of the first linkage beam 9 is opposite to that of the second linkage beams 11. As the first linkage beam 9 is connected with the outer edges of the ring-shaped upper polar plates 8 via the third linkage beam 24, and through the support beam group 18, the ring-shaped upper polar plates 8 are fixed onto the substrate 1 at the origin via the first anchor point 5a, the ring-shaped upper polar plates 8 will rotate around the first anchor point 5a under the dragging of the first linkage beam 9. That is, the ring-shaped upper polar plates perform angular vibration around the z-axis. Therefore, the driving movement refers to the linear movement of the rectangular inner and outer frames in the y-axis direction and the angular vibration of the upper polar plates 8 around the z-axis.

When the gyroscope is rotated around the x-axis, the ring-shaped upper polar plates 8 perform angular vibration around the y-axis under the action of Coriolis force, such that a distance between the first group of lower polar plates 6a and the ring-shaped upper polar plates 8 is changed, resulting in the change of the first detection capacitor A. This change of the capacitor is proportional to the angular velocity of the gyroscope when the gyroscope is rotated around the x-axis, and thus, it can be used to measure the x-axis angular velocity. Here, the first detection capacitor B and the second detection capacitor are hardly affected, or the influence is little enough to be neglected.

When the gyroscope is rotated around the y-axis, the ring-shaped upper polar plates 8 perform angular vibration around the x-axis under the action of Coriolis force, such that a distance between the second group of lower polar plates 6b and the ring-shaped upper polar plates 8 is changed, resulting in the change of the first detection capacitor B. This change of the capacitor is proportional to the angular velocity of the gyroscope when the gyroscope is rotated around the y-axis, and thus, it can be used to measure the y-axis angular velocity. Here, the first detection capacitor A and the second detection capacitor are hardly affected, or the influence is little enough to be neglected.

When the gyroscope is rotated around the z-axis, the ring-shaped upper polar plates 8 which perform angular vibration around the z-axis are not affected. The rectangular outer frame 14 and the rectangular inner frame 13 are subjected to the x-axis force due to the action of the Coriolis force. However, each lever beam 10 is rigid and has one fixed end, so that the movement of the rectangular inner frame 13 in the x-axis direction is limited; it will not affect the ring-shaped upper polar plates 8, so does the ring-shaped detection capacitor. Due to a decoupling action of the Z-shaped decoupling beams 15, the Z-shaped decoupling beams 15 for connecting with the rectangular outer frame will not limit the movement of the rectangular outer frame 14 in the x-axis direction. Therefore, the rectangular outer frame 14 will linearly move in the x-axis direction, which causes the change of the second detection capacitor (consisting of the movable detection electrodes 17 and the fixed detection electrodes 3). This change of the capacitor reflects the angular velocity of the gyroscope when the gyroscope is rotated around the z-axis, and thus, it can be used to measure the z-axis angular velocity.

In this embodiment, the lever beams 10 are not only connected with the first linkage beam 9, the second linkage beams 11 and the support beams 12, but also are fixed onto the substrate 1 (namely, at the second anchor points 5b) via the support ends; and moreover, the connection position of each second linkage beam 11 and the corresponding lever beam 10 is located in the middle of the support end of the level beam 10 and a connection point of the level beam 10 and the corresponding support beam 12. This arrangement is advantageous for the movement of the rectangular inner and outer frames as after original free ends of the lever beams 10 are fixed as the support ends, the lever beams 10 between the second anchor points 5b and the support beams 12 are equivalent to two sections of the support beams, and the deformation form of each section of the lever beam 10 is that the two ends are fixed while the middle is protruding; but the lever beams are still perpendicular to the y-axis; here, if the second linkage beams 11 are in the middle positions, they will not rotate due to torques, further ensuring that the rectangular inner frame 13 only moves in the y-axis direction; if the second linkage beams deviate from the middle positions, the lever beams 10 are not perpendicular to the y-axis any longer, and the deviation will affect a movement mode of the rectangular inner and outer frames.

According to the micro-electromechanical deformable structure in the first embodiment, each of the outer frame, the inner frame and the box structure will deform due to the action of an external force, and meanwhile, the advantages of small deformation resistance and large deformation space are achieved, so that the excellent measurement accuracy and sensitivity can be realized. The micro-electromechanical deformable structure of the present invention is simple and compact in structure, so that the size of the micro-electromechanical system is reduced advantageously, and it is suitable for mass production in process. Except for being applied to the triaxial gyroscope of the present invention, the micro-electromechanical deformable structure can amplify mini-displacement in the mechanical structure level, so that the improvement of the detection sensitivity of a sensor and a signal-to-noise ratio is facilitated, and the requirement of a sensitive structure on a circuit system is reduced.

Figure 7:
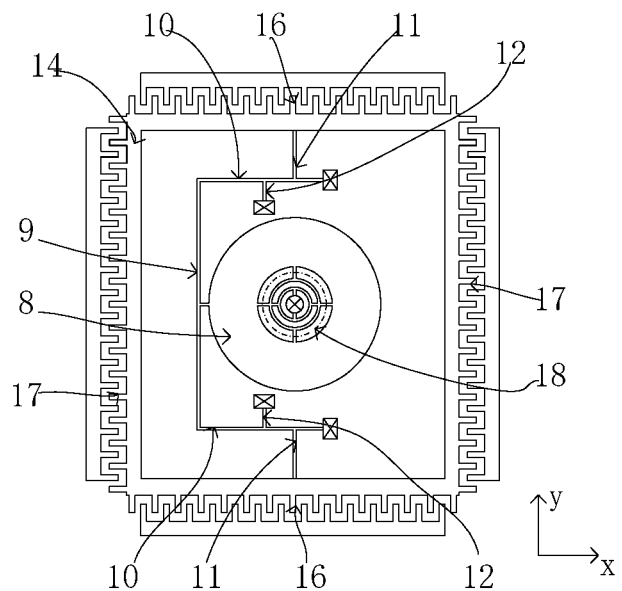
FIG. 7 is a schematic plan view of a triaxial micro-electromechanical gyroscope according to a second embodiment of the present invention.

II. FIG. 7 shows a triaxial micro-electromechanical gyroscope according to a second embodiment of the present invention.

It can be seen from FIG. 7 that the difference between the first embodiment and the second embodiment mainly lies in the linkage part. In particular, there is no rectangular inner frame in the second embodiment.

Figure 8:
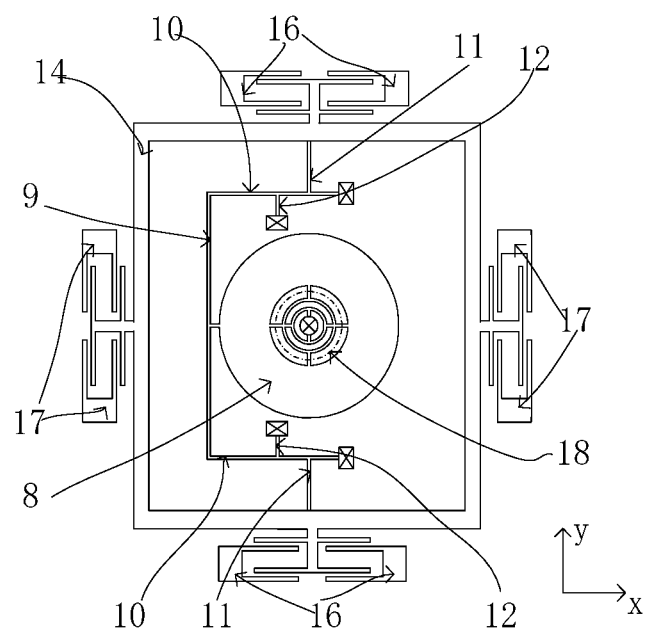
FIG. 8 is a schematic plan view of a triaxial micro-electromechanical gyroscope according to a third embodiment of the present invention.

III. FIG. 8 shows a triaxial micro-electromechanical gyroscope according to a third embodiment of the present invention.

It can be seen from FIG. 8 that the difference between the second embodiment and the third embodiment mainly lies in structures of the driving capacitor and the second detection capacitor. In the second embodiment, the driving capacitors and the second detection capacitors are comb-like capacitors, and detection is performed based on the change of overlapping lengths of every two polar plates. In the third embodiment, the driving capacitors and the second detection capacitors are special-shaped flat capacitors, and detection is performed based on the change of gaps of every two polar plates.

Figure 9:
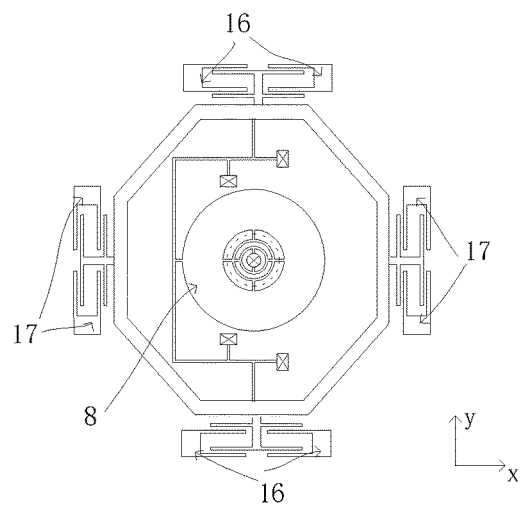
FIG. 9 is a schematic plan view of a triaxial micro-electromechanical gyroscope according to a fourth embodiment of the present invention.
Figure 10:
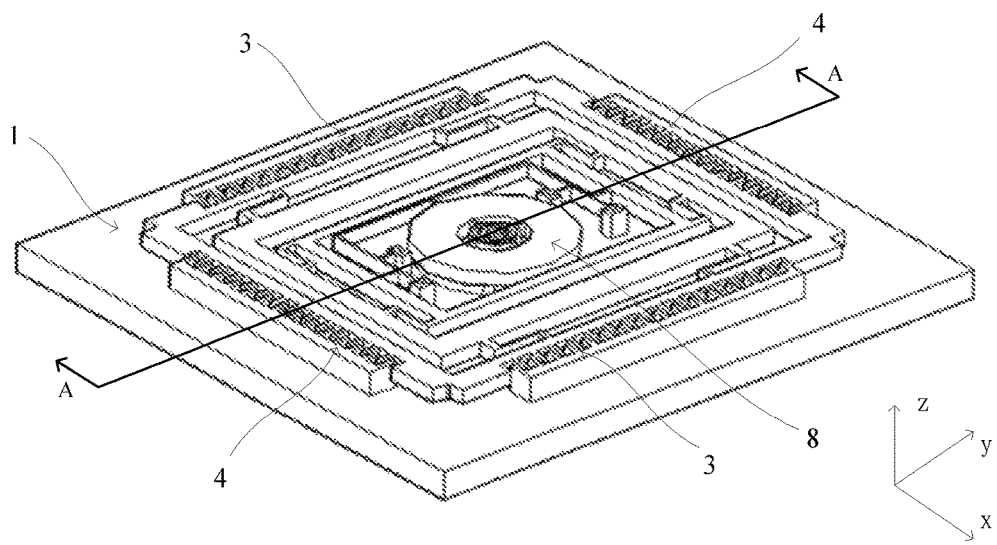
FIGS. 10 and 11 are schematic perspective views of a triaxial micro-electromechanical gyroscope according to a fifth embodiment of the present invention.
Figure 11:
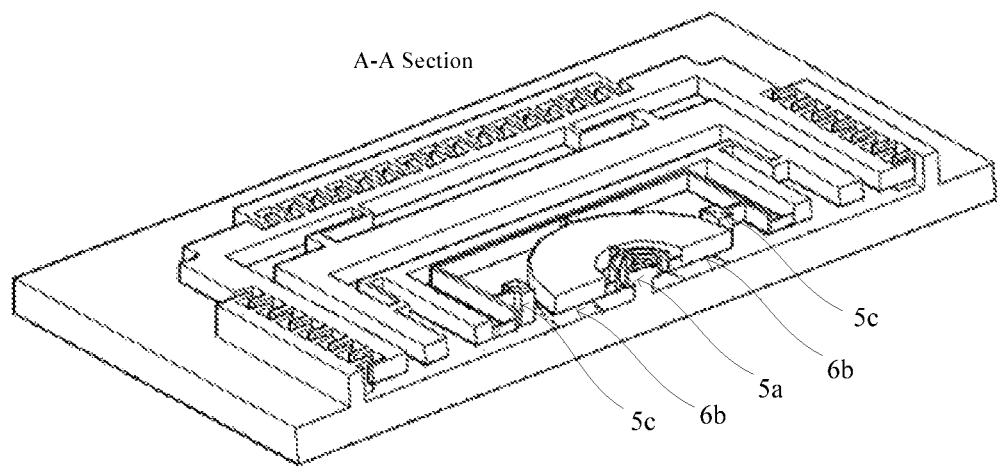
Figure 12:
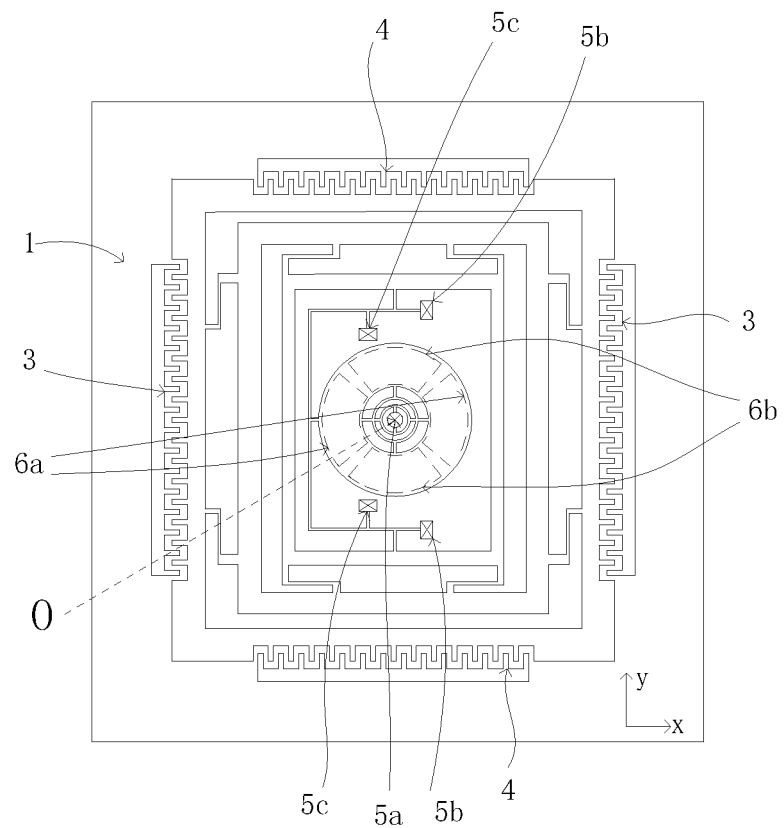
FIGS. 12 and 13 are schematic plan views of the triaxial micro-electromechanical gyroscope according to the fifth embodiment of the present invention.
Figure 13:
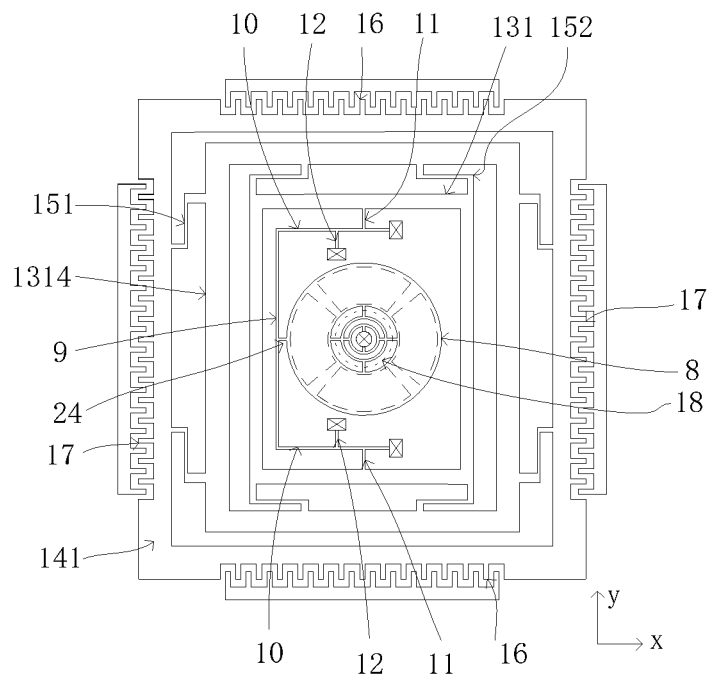

IV. FIG. 9 shows a triaxial micro-electromechanical gyroscope according to a fourth embodiment of the present invention.

It can be seen from FIG. 9 that the difference between the third embodiment and the fourth embodiment mainly lies in the structures of the linkage part. In the third embodiment, the driving capacitors transmit the driving force to the second detection capacitors by means of the rectangular outer frame. In the fourth embodiment, the driving capacitors transmit the driving force to the second detection capacitors by means of an octagonal outer frame.

It can be seen from the second, third and fourth embodiments that the driving capacitors and the second detection capacitors of the present invention are not limited to the comb-like capacitors, and the structure of the linkage part is not limited to the specific structures in the embodiments. According to the present invention, when the driving capacitors perform driving in the y-axis direction, all that is needed is to drive the movable detection electrodes to linearly move in the y-axis direction and the ring-shaped upper polar plates to rotate around the first anchor point via the linkage part. Thus, all designs of the linkage part capable of achieving this function should belong to the protection scope of the present invention.

V. FIGS. 10-13 show a triaxial micro-electromechanical gyroscope according to a fifth embodiment of the present invention.

The ring-shaped detection capacitor, the support beam support of the ring-shaped detection capacitor, the driving capacitor and the second detection capacitor in the fifth embodiment are similar to those in the first embodiment. The main difference of the fifth embodiment lies in that the structure of the linkage part for connecting with the ring-shaped detection capacitor, the driving capacitor and the second detection capacitor is different from that of any above-mentioned linkage part.

The linkage part in the fifth embodiment is a micro-electromechanical deformable structure, comprising: a three-layered rectangular frame which adopts the origin as the center and includes an inner frame 13, an intermediate frame 1314 encircling the inner frame 13, and an outer frame 14 encircling the intermediate frame 1314 from inside to outside sequentially. The centers of the inner frame 13, the intermediate frame 1314 and the outer frame 14 directly face the origin. Each of the inner frame 13, the intermediate frame 1314 and the outer frame 14 has two sides parallel to the x-axis while the other two sides thereof are parallel to the y-axis.

The outer frame 14 and the intermediate frame 1314 are connected via four first decoupling beams 151; and the first decoupling beams 151 are arranged at two sides, parallel to the y-axis, of the intermediate frame 1314, and are symmetrical with respect to the y-axis. The first decoupling beams 151 are Z-type decoupling beams whose one ends are vertically connected with the sides, parallel to the y-axis, of the intermediate frame 1314, and the other ends thereof are vertically connected with the sides, parallel to the y-axis, of the outer frame 14.

The intermediate frame 1314 and the inner frame 13 are connected via four second decoupling beams 152; and the second decoupling beams 152 are arranged at two sides, parallel to the x-axis, of the inner frame 13, and are symmetrical with respect to the x-axis. The second decoupling beams 152 are Z-type decoupling beams whose one ends are vertically connected with the sides, parallel to the x-axis, of the inner frame 13, and the other ends thereof are vertically connected with the sides, parallel to the x-axis, of the intermediate frame 1314.

A third linkage part is located inside the inner frame 13. The third linkage part comprises a first linkage beam 9, two lever beams 10, two second linkage beams 12 and a third linkage beam 24. The first linkage beam 9, the second linkage beams 11 and the support beams 12 are parallel to the y-axis, and the lever beams 10 and the third linkage beam 24 are parallel to the x-axis. The two lever beams 10 are symmetrical with respect to the x-axis and are respectively connected with the first linkage beam 9 to form a box structure with an open end. The box structure is located inside the inner frame 13, and the ring-shaped detection capacitor is located between the two lever beams 10. The second linkage beams 11 are symmetrical with respect to the x-axis and are located between the lever beams 10 and the inner frame 13. One end of the second linkage beam 11 is connected with the adjacent lever beam 10, and the other end thereof is connected with the inner frame 13, so that the inner frame 13 is connected with the intermediate frame 1314, and thus is connected with the outer frame 14. One end of the third linkage beam 24 is connected with the middle part of the first linkage beam 9, and the other end thereof is connected with the outer edge of the ring-shaped upper polar plate 8. The two support beams 12 are symmetrical with respect to the x-axis and are located between the box structure and the ring-shaped detection capacitor. One end of the support beam is connected with the adjacent lever beam 10, and the other end thereof is fixed onto the substrate 1 via a third anchor point 5c. The end, unconnected with the first linkage beam 9, of the lever beam 10 serves as a support end, and the two support ends of the two lever beams 10 are fixed onto the substrate 1 via second anchor points 5b, respectively. A connection position of each second linkage beam 11 and the corresponding lever beam 10 is located in the middle of the support end of the level beam 10 and a connection point of the level beam 10 and the corresponding support beam 12. The two second anchor points 5b are symmetric with respect to the x-axis, and the two third anchor points 5c are symmetric with respect to the x-axis, such that the ring-shaped detection capacitor is stressed uniformly further by virtue of this symmetrical and fixed arrangement.

According to the micro-electromechanical deformable structure in the fifth embodiment, each of the outer frame, the intermediate frame, the inner frame and the box structure will deform due to the action of an external force, and moreover, the advantages of small deformation resistance and large deformation space are achieved, so that the excellent measurement accuracy and sensitivity can be realized. In addition, the influence of temperature and processing technology error on the micro-electromechanical deformable structure is less, so that a measurement solution can realize excellent measurement accuracy and sensitivity advantageously. Except for being applied to the triaxial gyroscope of the present invention, the micro-electromechanical deformable structure can amplify mini-displacement in the mechanical structure level, so that the improvement of the detection sensitivity of a sensor and a signal-to-noise ratio is facilitated, and the requirement of a sensitive structure on a circuit system is reduced.

The two sets of driving capacitors are symmetrically distributed at two sides, parallel to the x-axis, of the outer frame 14. Each set of the driving capacitors comprises a movable driving electrode 16 and a fixed driving electrode 4 cooperated with each other. The movable driving electrodes 16 are connected with the sides, parallel to the x-axis, of the outer frame 14, and the fixed driving electrodes 4 are fixed onto the substrate 1.

The two sets of second detection capacitors are symmetrically distributed at two sides, parallel to the y-axis, of the outer frame 14. Each set of second detection capacitor comprises a movable detection electrode 17 and a fixed detection electrode 3 cooperated with each other. The movable detection electrodes 17 are connected with the sides, parallel to the y-axis, of the outer frame 14, and the fixed detection electrodes 3 are fixed onto the substrate 1.

In this embodiment, the movable driving electrodes 16, the fixed driving electrodes 4, the movable detection electrodes 17 and the fixed detection electrodes 3 are comb-shaped electrodes, and the detection is performed based on the change of overlapping lengths of every two polar plates. However, the present invention is not limited thereto, the driving capacitors and the second detection capacitors may be flat capacitors, and detection is performed based on the change of gaps of every two polar plates.

The working principle of the triaxial multi-degree-of-freedom micro-electromechanical gyroscope according to the fifth embodiment of the present invention is as follows.

The driving capacitors are used to provide driving force in the y-axis direction. When driven by an external force, the outer frame 14, the movable driving electrodes 16 and the movable detection electrodes 17 are linearly moved in the y-axis direction, so as to drive the intermediate frame 1314 and the inner frame 13 to move in the y-axis direction. Meanwhile, the second linkage beams 11 drag the lever beams 10 to linearly move in the y-axis direction, such that the first linkage beam 9 is driven to linearly moved in the y-axis direction as the lever beams 10 are equivalent to levers, wherein the movement direction of the first linkage beam 9 is opposite to that of the second linkage beams 11. As the first linkage beam 9 is connected with the outer edges of the ring-shaped upper polar plates 8 via the third linkage beam 24, and through the support beam group 18, the ring-shaped upper polar plates 8 are fixed onto the substrate 1 at the origin via the first anchor point 5a, the ring-shaped upper polar plates 8 will rotate around the first anchor point 5a under the dragging of the first linkage beam 9. That is, the ring-shaped upper polar plates perform angular vibration along the z-axis. Therefore, the driving movement refers to the linear movement of the three-layered frame in the y-axis direction and the angular vibration of the ring-shaped upper polar plates 8 around the z-axis.

When the gyroscope is rotated around the x-axis, the ring-shaped upper polar plates 8 perform angular vibration around the y-axis under the action of Coriolis force, such that a distance between the first group of lower polar plates 6a and the ring-shaped upper polar plates 8 is changed, resulting in the change of the first detection capacitor A. This change of the capacitor is proportional to the angular velocity of the gyroscope when it is rotated around the x-axis, and thus, the measurement of the x-axis angular velocity can be realized. Here, the first detection capacitor B and the second detection capacitor are hardly affected, or the influence is little enough to be neglected.

When the gyroscope is rotated around the y-axis, the ring-shaped upper polar plates 8 perform angular vibration along the x-axis under the action of Coriolis force, such that a distance between the second group of lower polar plates 6b and the ring-shaped upper polar plates 8 is changed, resulting in the change of the second detection capacitor B. This change of the capacitor is proportional to the angular velocity of the gyroscope when it is rotated along the y-axis, and thus, the measurement of the y-axis angular velocity can be realized. Here, the first detection capacitor A and the second detection capacitor are hardly affected, or the influence is little enough to be neglected.

When the gyroscope is rotated around the z-axis, the ring-shaped upper polar plates 8 which perform angular vibration around the z-axis are not affected. The outer frame 14, the intermediate frame 1314 and the inner frame 13 are subjected to the force in the x-axis direction due to the action of the Coriolis force. However, each lever beam 10 is rigid and has one fixed end, so that the movement of the inner frame 13 in the x-axis direction is limited; it will not affect the ring-shaped upper polar plates 8, so does the ring-shaped detection capacitor. Due to a decoupling action of the first decoupling beams 151, the movement of the outer frame 14 in the x-axis direction will not be limited. Therefore, the outer frame 14 will linearly move in the x-axis direction, which causes the change of the second detection capacitor (consisting of the movable detection electrodes 17 and the fixed detection electrodes 3). This change of the capacitor reflects the angular velocity of the gyroscope when the gyroscope is rotated around the z-axis, and thus, it can be used to measure the z-axis angular velocity can be realized.

In this embodiment, the lever beams 10 are not only connected with the first linkage beam 9, the second linkage beams 11 and the support beams 12, but also fixed onto the substrate 1 (namely, at the second anchor points 5b) via the support ends; and moreover, the connection position of each second linkage beam 11 and the corresponding lever beam 10 is located in the middle of the support end of the level beam 10 and a connection point of the level beam 10 and the corresponding support beam 12. This arrangement is advantageous for the movement of the three-layered frame as after original free ends of the lever beams 10 are fixed as the support ends, the lever beams 10 between the second anchor points 5b and the support beams 12 are equivalent to two sections of the support beams, and the deformation form of each section of the lever beam 10 is that the two ends are fixed while the middle is protruding; but the lever beams are still perpendicular to the y-axis; here, if the second linkage beams 11 are in the middle positions, they will not rotate due to torques, further ensuring that the rectangular inner frame 13 only moves in the y-axis direction; and if the second linkage beams deviate from the middle positions, the lever beams 10 are not perpendicular to the y-axis any longer, and the deviation will affect a movement mode of the three-layered frame.

Figure 14:
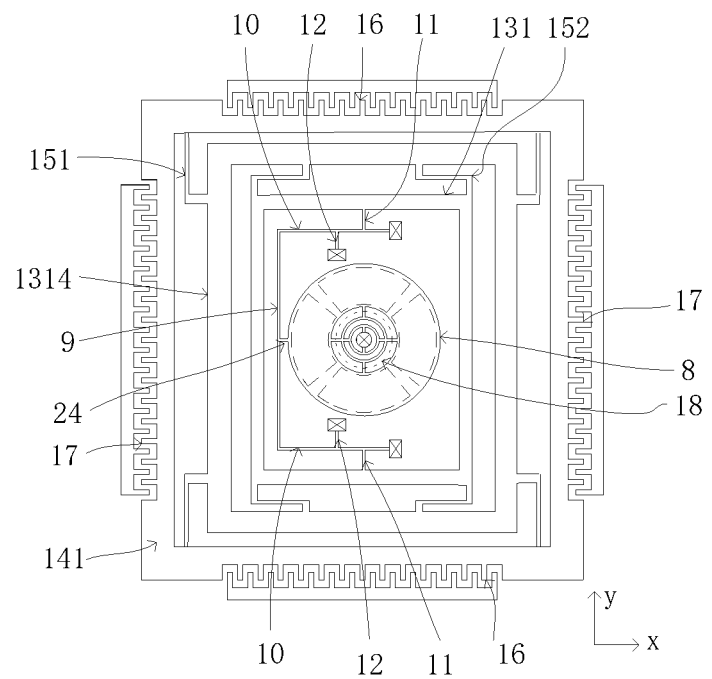
FIG. 14 is a schematic plan view of a triaxial micro-electromechanical gyroscope according to a sixth embodiment of the present invention.

VI. FIG. 14 shows a triaxial micro-electromechanical gyroscope according to a sixth embodiment of the present invention.

The sixth embodiment and the fifth embodiment are the same in triaxial detection principle. The main difference between the sixth embodiment and the fifth embodiment lies in the shape and the connecting manner of the first decoupling beams 151. In the sixth embodiment, the outer frame 14 and the intermediate frame 1314 are connected via four first decoupling beams 151. The first decoupling beams 151 are arranged at the two sides, parallel to the y-axis, of the intermediate frame 1314, and are symmetrical with respect to the y-axis. The first decoupling beams 151 are L-type decoupling beams whose one ends are vertically connected with the sides, parallel to the y-axis, of the intermediate frame 1314, and the other ends thereof are vertically connected with the sides, parallel to the x-axis, of the outer frame 14.

Figure 15:
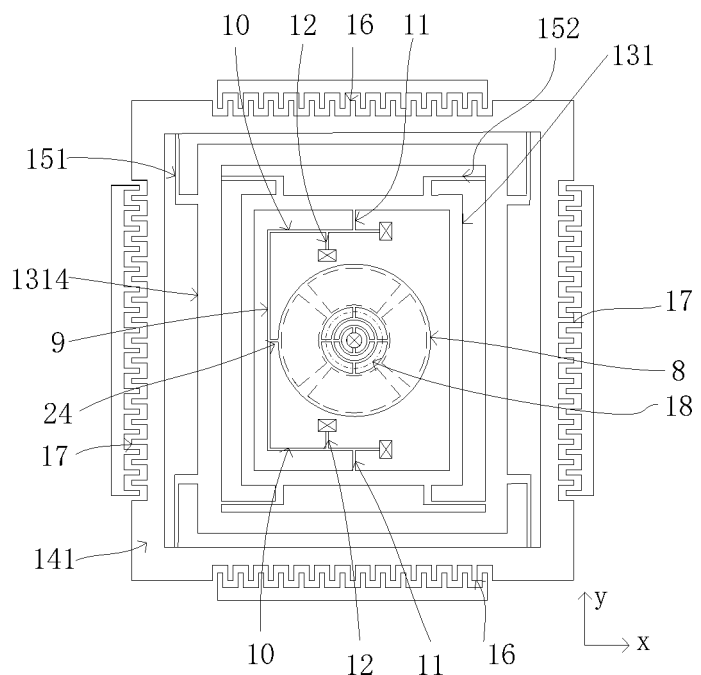
FIG. 15 is a schematic plan view of a triaxial micro-electromechanical gyroscope according to a seventh embodiment of the present invention.

VII. FIG. 15 shows a triaxial micro-electromechanical gyroscope according to a seventh embodiment of the present invention.

The seventh embodiment and the fifth embodiment are the same in triaxial detection principle. The main difference between the seventh embodiment and the sixth embodiment lies in the shape and the connecting manner of the second decoupling beams 152. In the seventh embodiment, the intermediate frame 1314 and the inner frame 13 are connected via four second decoupling beams 152. The second decoupling beams 152 are arranged at the two sides, parallel to the x-axis, of the inner frame 13, and are symmetrical with respect to the x-axis. The second decoupling beams 152 are L-type decoupling beams whose one ends are vertically connected with the sides, parallel to the x-axis, of the inner frame 13, and the other ends thereof are vertically connected with the sides, parallel to the y-axis, of the intermediate frame 1314.

The gyroscope according to any of the fifth, sixth and seventh embodiments of the present invention is particularly designed with a three-layered rectangular frame structure. In the structure, the inner frame and the intermediate frame are connected via the Z-type or L-type second decoupling beams; and the intermediate frame and the outer frame are connected via the Z-type or L-type first decoupling beams, wherein the first decoupling beams limit the relative movement of the outer frame 14 and the intermediate frame 1314 in the y-axis direction; and the second decoupling beams limit the relative movement of the intermediate frame 1314 and the inner frame 13 in the x-axis direction. Through this special design, the robustness of the gyroscope is improved. Beneficial effects of this design are described with reference to FIGS. 16-19.

Figure 16:
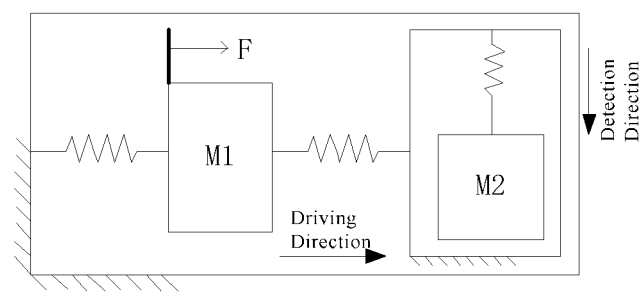
FIG. 16 is a simplified schematic view of an x-axis and y-axis detection system of the triaxial micro-electromechanical gyroscope according to the fifth, sixth and seventh embodiments of the present invention.
Figure 17:
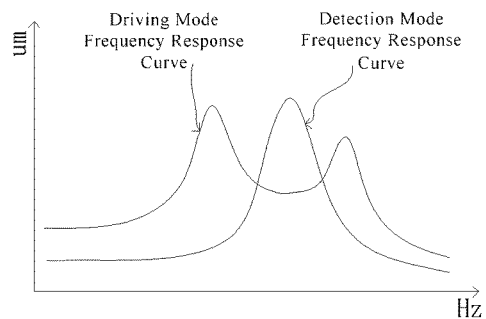
FIG. 17 shows frequency response curves of a detection mass block M2 in the driving and detection directions during the x-axis and y-axis detection of the triaxial micro-electromechanical gyroscope according to the fifth, sixth and seventh embodiments of the present invention.
Figure 18:
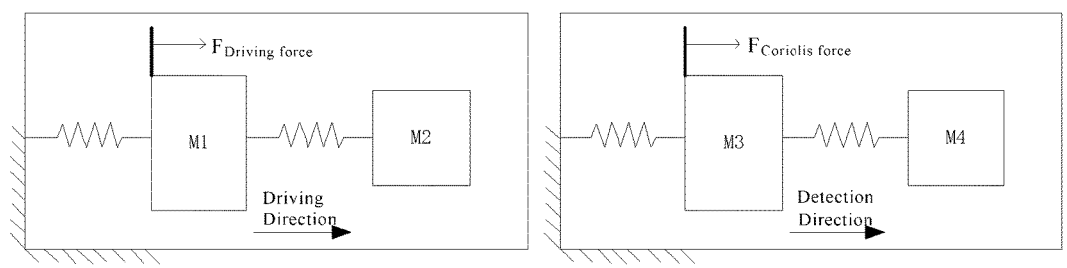
FIGS. 18(a) and 18(b) are simplified schematic views of a z-axis detection system of the triaxial micro-electromechanical gyroscope according to the fifth, sixth and seventh embodiments of the present invention.

FIG. 16 is a simplified schematic view of an x-axis and y-axis detection system of the triaxial micro-electromechanical gyroscope according to the fifth, sixth and seventh embodiments of the present invention; and FIG. 17 shows frequency response curves of a detection mass block M2 in the driving and detection directions during the x-axis and y-axis detection according to the fifth, sixth and seventh embodiments of the present invention.

Referring to FIG. 16, as the first decoupling beams 151 limit the relative movement of the outer frame 14 and the intermediate frame 1314 in the y-axis direction, the combination of the outer frame 14 and the intermediate frame 1314 may be simplified to a mass block Ml, and the combination of the inner frame 13, the ring-shaped upper polar plates 8, and the all beams for connecting the inner frame with the ring-shaped upper polar plates may be simplified to the detection mass block M2. Referring to FIG. 17, when being subjected to driving force, the mass block M1 drives the detection mass block M2 to move in the driving direction, in which the mass block M1 can only move in the driving direction, while the detection mass block M2 can move in the driving direction and the detection directions at the same time. In a driving movement frequency response curve of the detection mass block M2, when a driving frequency is in a straight segment between two peaks of the driving frequency response curve, the whole system realizes dynamic magnification. That is, the movement amplitude of the mass block M1 is minimized, and the movement amplitude of the detection mass block M2 reaches the maximum. In addition, at the same time, the change of the resonant frequency caused by temperature and processing error has little effect on the frequency response at the driving straight segment, so the change of the gyroscope o driving movement is less, improving the stability of the gyroscope driving operation. Further, at the same time, it is possible to realize the matching of the driving frequency and a detection frequency by designing a natural frequency of a detection mode of the detection mass block M2 in the detection direction at the straight segment between the two peaks of the driving frequency response curve, which improves the detection accuracy and sensitivity of the gyroscope.

Figure 19:
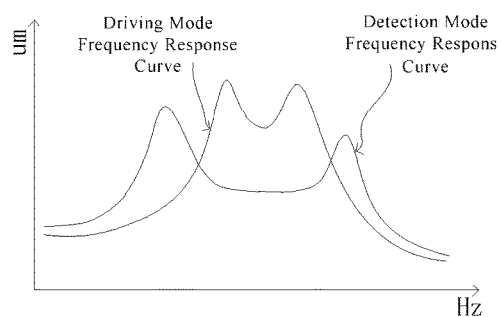
FIG. 19 shows frequency response curves of a detection mass block M4 in the driving and detection directions during the z-axis detection of the triaxial micro-electromechanical gyroscope according to the fifth, sixth and seventh embodiments of the present invention.

FIGS. 18(a) and 18(b) are simplified schematic views of a z-axis detection system of the triaxial micro-electromechanical gyroscope according to the fifth, sixth and seventh embodiments of the present invention; and FIG. 19 shows frequency response curves of a detection mass block M4 in the driving and detection directions during the z-axis detection according to the fifth, sixth and seventh embodiments of the present invention.

Referring to FIG. 18(a), the principle of the dynamic magnification of the driving movement of the z-axis detection system is the same as that of FIG. 16 since they belong to the same driving movement. Referring to FIG. 18(b), when the gyroscope structure rotates around the z-axis, the inner frame 13 is driven by the Coriolis force in the x-axis direction, and the second decoupling beams 152 limit the relative movement of the inner frame 13 and the intermediate frame 1314 in the x-axis direction, so that the inner frame 13 and the outer frame 14 are equivalent to two fixedly-connected mass blocks which can be simplified to a mass block M3. The connection of the outer frame 14 and the intermediate frame 1314 is equivalent to spring connection in the x-axis direction, so that the outer frame 14 may be simplified to the detection mass block M4. Referring to FIG. 19, the mass block M3 is subjected to the Coriolis force to drive the mass block M4 to move in the detection direction; when the frequency of the Coriolis force is in a straight segment between two peaks of the detection mode curve, the movement displacement of the detection mass block M4 is maximized, while the movement displacement of the mass block M3 is minimized. That is, the dynamic amplification is realized. Meanwhile, the structure has the characteristic of less influence of temperature and processing error, such that the improvement of the stability of the driving and detection movement of the system as well as the detection accuracy and sensitivity of the gyroscope is facilitated.

The triaxial micro-electromechanical gyroscope provided by the present invention adopts a single structure design, and integrates capacitive electrostatic driving and differential capacitive detection, so that the driving manner is simple, the structure is compact, the gyroscope size is reduced advantageously, and the gyroscope is suitable for mass production in process. In addition, the influence of temperature and processing technology error on the gyroscope is less, so that excellent measurement accuracy and sensitivity can be realized.

Figure 20:
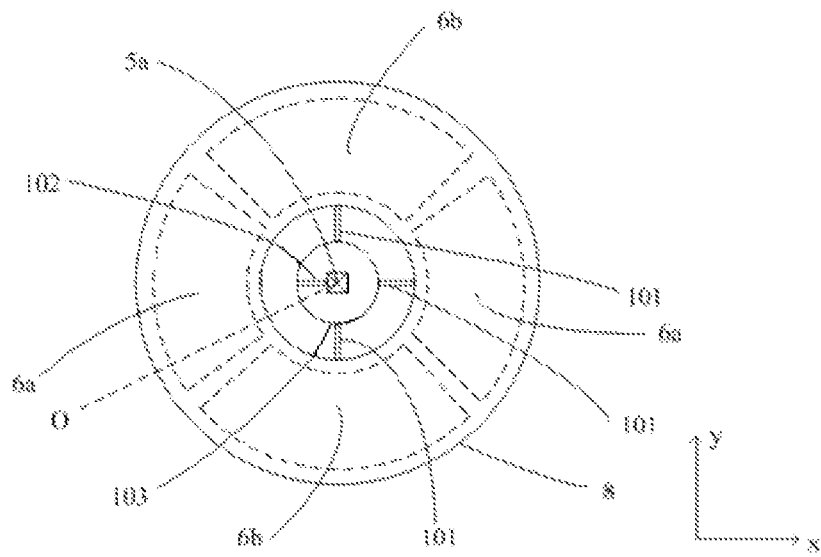
FIG. 20 is a schematically structural view of a support beam group of the triaxial micro-electromechanical gyroscope according to a second embodiment of the present invention.

FIG. 20 shows a support structure according to a second embodiment. The support structure comprises a ring 103, three connecting beams 101 and a support beam 102. The two connecting beams 101 are distributed along the y-axis, and the third connecting beam 101 is arranged along the x-axis and is located in the positive direction of the x-axis; and one ends of the connecting beams 101 are connected with the ring 103, and the other ends thereof are connected with the inner edge of the ring-shaped upper polar plates 8. The support beam 102 is arranged along the x-axis, and is located in the negative direction of the x-axis; and one end of the support beam is connected with the ring 103, and the other end thereof is fixed onto the substrate at the origin via the first anchor point 5a. Of course, it is also possible that the third connecting beam 101 is located in the negative direction of the x-axis and the supporting beam 102 is located in the positive direction of the x-axis.

Figure 21:
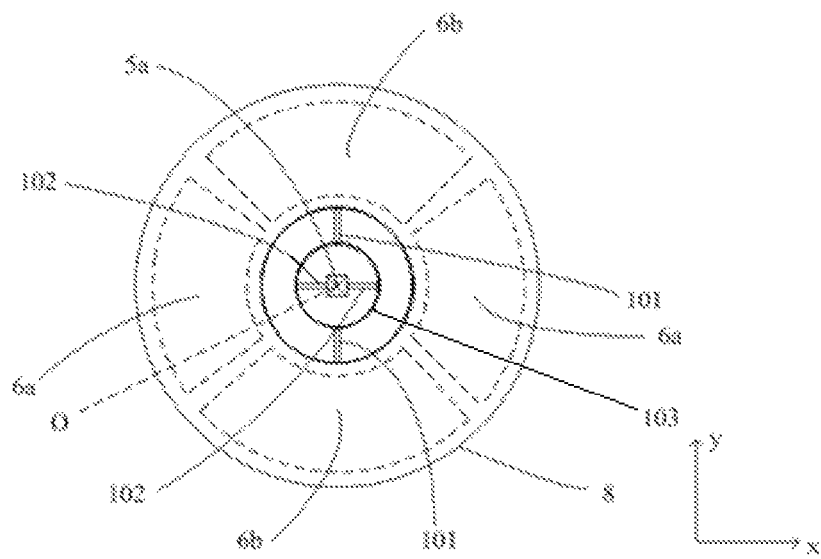
FIG. 21 is a schematically structural view of a support beam group of the triaxial micro-electromechanical gyroscope according to a third embodiment of the present invention.

FIG. 21 shows a support structure according to a third embodiment. The support structure comprises a ring 103, two connecting beams 101 and two support beams 102. The two connecting beams 101 are distributed along the y-axis; and one ends of the connecting beams 101 are connected with the ring 103, and the other ends thereof are connected with the inner edge of the ring-shaped upper polar plates 8. The two support beams 102 are distributed along the x-axis; and one ends of the support beams are connected with the ring 103, and the other ends thereof are fixed onto the substrate at the origin via the first anchor point 5a.

Although some specific embodiments of the present invention have been demonstrated in detail with examples, it should be understood by a person skilled in the art that the above examples are only intended to be illustrative but not to limit the scope of the present invention. It should be understood by those skilled in the art that the above embodiments can be modified without departing from the scope and spirit of the present invention. The scope of the present invention is defined by the appended claims.

The invention claimed is:

1. A triaxial micro-electromechanical gyroscope, comprising:
a substrate;
a ring-shaped detection capacitor located at a central position of the substrate, wherein the center of the ring-shaped detection capacitor is an origin, the ring-shaped detection capacitor includes four lower polar plates fixed onto the substrate and a ring-shaped upper polar plate that directly faces and is hung above the four lower polar plates, the four lower polar plates are divided into two groups, the first group of lower polar plates is symmetrically distributed at two sides of the origin along an x-axis, and cooperates with the corresponding ring-shaped upper polar plate to form a set of first detection capacitors, the second group of lower polar plates is symmetrically distributed at the two sides of the origin along a y-axis, and cooperates with the corresponding ring-shaped upper polar plate to form another set of first detection capacitors, and the ring-shaped upper polar plate is fixed onto the substrate at the origin via a first anchor point;
two sets of driving capacitors which are located at the outer sides of the ring-shaped detection capacitor respectively and are symmetrically distributed at the two sides of the origin along the y-axis, wherein each set of the driving capacitors comprises a movable driving electrode and a fixed driving electrode which cooperate with each other;
two sets of second detection capacitors which are located at the outer sides of the ring-shaped detection capacitor respectively and are symmetrically distributed at the two sides of the origin along the x-axis, wherein each set of the second detection capacitors comprises a movable detection electrode and a fixed detection electrode which cooperate with each other; and
a linkage part connected with the movable driving electrodes, the movable detection electrodes, and outer edges of the ring-shaped upper polar plate, respectively, wherein the driving capacitors are configured for providing driving forces in the y-axis direction, and driving the movable detection electrodes to linearly move in the y-axis direction as well as the ring-shaped upper polar plate to rotate around the first anchor point via the linkage part,
the linkage part comprises a rectangular outer frame and a first linkage part located inside the rectangular outer frame, wherein the rectangular outer frame encircles the ring-shaped detection capacitor, and the rectangular outer frame is connected with the outer edges of the ring-shaped upper polar plate via the first linkage part;
the two sets of driving capacitors are symmetrically distributed at two sides, parallel to the x-axis, of the rectangular outer frame, and the movable driving electrodes are connected with sides, parallel to the x-axis, of the rectangular outer frame;
the two sets of second detection capacitors are symmetrically distributed at two sides, parallel to the y-axis, of the rectangular outer frame, and the movable detection electrodes are connected with sides, parallel to the y-axis, of the rectangular outer frame; and the driving capacitors drive the rectangular outer frame to linearly move in the y-axis direction, and the rectangular outer frame that linearly moves in the y-axis direction drives the ring-shaped upper polar plate to rotate around the first anchor point via the first linkage part, wherein:
the first linkage part includes a first linkage beam, two lever beams, two second linkage beams and a third linkage beam;
the first linkage beam and the second linkage beams are parallel to the y-axis, and the lever beams and the third linkage beam are parallel to the x-axis;
the two lever beams are respectively connected with the first linkage beam to form a box structure with an open end.

2. The triaxial micro-electromechanical gyroscope of claim 1, wherein:
the movable driving electrodes and the fixed driving electrodes are comb-shaped electrodes, and the movable detection electrodes and the fixed detection electrodes are comb-shaped electrodes.

3. The triaxial micro-electromechanical gyroscope of claim 1, wherein: the ring-shaped upper polar plate takes the shape of a ring or a square ring.

4. The triaxial micro-electromechanical gyroscope of claim 1, wherein: the two lower polar plates in the first group of lower polar plates have the same shape, and the two lower polar plates in the second group of lower polar plates have the same shape.

5. The triaxial micro-electromechanical gyroscope of claim 1, wherein:
the ring-shaped detection capacitor is located between the two lever beams;
the two second linkage beams are symmetrical with respect to the x-axis and are located between the lever beams and the rectangular outer frame;
one end of the second linkage beam is connected with the adjacent lever beam, and the other end thereof is connected with the rectangular outer frame; and
one end of the third linkage beam is connected with the middle part of the first linkage beam, and the other end thereof is connected with the outer edge of the ring-shaped upper polar plate.

6. The triaxial micro-electromechanical gyroscope of claim 5, wherein:
the first linkage part further comprises two support beams, and the two support beams are parallel to the y-axis, respectively;
the two support beams are symmetrical with respect to the x-axis and are located between the box structure and the ring-shaped detection capacitor;
one end of the support beam is connected with the adjacent lever beam, and the other end thereof is fixed onto the substrate via a third anchor point.

7. The triaxial micro-electromechanical gyroscope of claim 6, wherein:
the end, unconnected with the first linkage beam, of the lever beam serves as a support end, and the support ends of the two lever beams are fixed onto the substrate via second anchor points, respectively; and
a connection position of each second linkage beam and the corresponding lever beam is located in the middle of the support end of the lever beam and a connection point of the level beam and the corresponding support beam.

8. The triaxial micro-electromechanical gyroscope of claim 5, wherein: the first linkage part further comprises a rectangular inner frame and a second linkage part, wherein the rectangular inner frame is located inside the rectangular outer frame and encircles the box structure, and the rectangular outer frame is connected with the rectangular inner frame via the second linkage part;
the second linkage beams are located between the lever beams and the rectangular inner frame, and are connected with the rectangular outer frame via the rectangular inner frame; and
the rectangular outer frame that linearly moves in the y-axis direction drives the rectangular inner frame to linearly move in the y-axis direction via the second linkage part.

9. The triaxial micro-electromechanical gyroscope of claim 8, wherein: the second linkage part is composed of Z-type decoupling beams; and
one ends of the Z-type decoupling beams are connected to the sides, parallel to the y-axis, of the rectangular inner frame, and the other ends thereof are connected to the sides, parallel to the y-axis, of the rectangular outer frame.

10. The triaxial micro-electromechanical gyroscope of claim 1, wherein: the linkage part comprises a three-layered rectangular frame, which is located on the substrate, adopts the origin as the center and includes an inner frame, an intermediate frame encircling the inner frame, and an outer frame encircling the intermediate frame from inside to outside sequentially, and each of the inner frame, the intermediate frame and the outer frame has two sides parallel to the x-axis while the other two sides thereof are parallel to the y-axis, wherein the outer frame is the rectangular outer frame;
the two sets of driving capacitors are symmetrically distributed at two sides, parallel to the x-axis, of the outer frame, and the movable driving electrodes are connected with the sides, parallel to the x-axis, of the outer frame;
the two sets of second detection capacitors are symmetrically distributed at two sides, parallel to the y-axis, of the outer frame, and the movable detection electrodes are connected with the sides, parallel to the y-axis, of the outer frame;
the outer frame is connected with the intermediate frame via first decoupling beams, and the first decoupling beams are arranged at the two sides, parallel to the y-axis, of the intermediate frame; and
the intermediate frame is connected with the inner frame via second decoupling beams, and the second decoupling beams are arranged at the two sides, parallel to the x-axis, of the inner frame;
the first linkage part is located inside the inner frame;
the two lever beams are symmetrical with respect to the x-axis, and the ring-shaped detection capacitor is located between the two lever beams; the two second linkage beams are symmetrical with respect to the x-axis and are located between the lever beams and the rectangular outer frame;
one end of the second linkage beam is connected with the adjacent lever beam and the other end thereof is connected with the inner frame; and
one end of the third linkage beam is connected with the middle part of the first linkage beam, and the other end thereof is connected with the outer edge of the ring-shaped upper polar plate.

11. The triaxial micro-electromechanical gyroscope of claim 10, wherein:

the first decoupling beams comprise four Z-type decoupling beams symmetrical with respect to the y-axis, one ends of the Z-type decoupling beams are vertically connected with the sides, parallel to the y-axis, of the intermediate frame, and the other ends thereof are vertically connected with the sides, parallel to the y-axis, of the outer frame;

or the first decoupling beams comprise four L-type decoupling beams symmetrical with respect to the y-axis, one ends of the L-shaped decoupling beams are vertically connected with the sides, parallel to the y-axis, of the intermediate frame, and the other ends thereof are vertically connected with the sides, parallel to the x-axis, of the outer frame; and the second decoupling beams comprise four Z-type decoupling beams symmetrical with respect to the x-axis, one ends of the Z-type decoupling beams are vertically connected with the sides, parallel to the x-axis, of the inner frame, and the other ends thereof are vertically connected with the sides, parallel to the x-axis, of the intermediate frame;

or the second decoupling beams comprise four L-type decoupling beams symmetrical with respect to the x-axis, one ends of the L-shaped decoupling beams are vertically connected with the sides, parallel to the x-axis, of the inner frame, and the other ends thereof are vertically connected with the sides, parallel to the y-axis, of the intermediate frame.

12. The triaxial micro-electromechanical gyroscope of claim 10, wherein:

the first linkage part further comprises two support beams, and the two support beams are parallel to the y-axis, respectively;

the two support beams are symmetrical with respect to the x-axis and are located between the box structure and the ring-shaped detection capacitor; and one end of the support beam is connected with the adjacent lever beam, and the other end thereof is fixed onto the substrate via a third anchor point.

13. The triaxial micro-electromechanical gyroscope of claim 12, wherein: the end, unconnected with the first linkage beam, of the lever beam serves as a support end, and the support ends of the two lever beams are fixed onto the substrate via second anchor points, respectively; and a connection position of each second linkage beam and the corresponding lever beam is located between the support end of the lever beam and a connection point of the level beam and the corresponding support beam.

14. The triaxial micro-electromechanical gyroscope of claim 1, further comprising:

a support beam group located inside the ring holes of the ring-shaped detection capacitor, wherein the support beam group comprises an inner ring and an outer ring which are concentric, two inner ring support beams, two inner and outer ring connecting beams and four outer ring connecting beams;

one ends of the four outer ring connecting beams are respectively connected with the outer ring, and the other ends thereof are respectively connected with the inner edges of the ring-shaped upper polar plate;

the outer ring connecting beams are divided into two groups, one group of outer ring connecting beams is distributed along the x-axis, and the other group of outer ring connecting beams is distributed along the y-axis;

one ends of the two inner ring support beams are respectively connected with the inner ring, and the other ends thereof are fixed onto the substrate at the origin via the first anchor point;

one ends of the two inner and outer ring connecting beams are respectively connected with the inner ring, and the other ends thereof are respectively connected with the outer ring; and the inner ring support beams are distributed along the y-axis, and the inner and outer ring connecting beams are distributed along the x-axis;

or, the inner ring support beams are distributed along the x-axis and the inner and outer ring connecting beams are distributed along the y-axis.

15. A triaxial micro-electromechanical gyroscope, comprising:

a substrate;

a ring-shaped detection capacitor located at a central position of the substrate, wherein the center of the ring-shaped detection capacitor is an origin, the ring-shaped detection capacitor includes four lower polar plates fixed onto the substrate and a ring-shaped upper polar plate that directly faces and is hung above the four lower polar plates, the four lower polar plates are divided into two groups, the first group of lower polar plates is symmetrically distributed at two sides of the origin along an x-axis, and cooperates with the corresponding ring-shaped upper polar plate to form a set of first detection capacitors, the second group of lower polar plates is symmetrically distributed at the two sides of the origin along a y-axis, and cooperates with the corresponding ring-shaped upper polar plate to form another set of first detection capacitors, and the ring-shaped upper polar plate is fixed onto the substrate at the origin via a first anchor point;

two sets of driving capacitors which are located at the outer sides of the ring-shaped detection capacitor respectively and are symmetrically distributed at the two sides of the origin along the y-axis, wherein each set of the driving capacitors comprises a movable driving electrode and a fixed driving electrode which cooperate with each other;

two sets of second detection capacitors which are located at the outer sides of the ring-shaped detection capacitor respectively and are symmetrically distributed at the two sides of the origin along the x-axis, wherein each set of the second detection capacitors comprises a movable detection electrode and a fixed detection electrode which cooperate with each other; and a linkage part connected with the movable driving electrodes, the movable detection electrodes, and outer edges of the ring-shaped upper polar plate, respectively, wherein the driving capacitors are configured for providing driving forces in the y-axis direction, and driving the movable detection electrodes to linearly move in the y-axis direction as well as the ring-shaped upper polar plate to rotate around the first anchor point via the linkage part, wherein:

the linkage part comprises a three-layered rectangular frame, which is located on the substrate, adopts the origin as the center and includes an inner frame, an intermediate frame encircling the inner frame, and an outer frame encircling the intermediate frame from inside to outside sequentially.

* * * * *